United States Patent
Belhumeur et al.

(10) Patent No.: US 8,400,161 B2
(45) Date of Patent: Mar. 19, 2013

(54) SHORT-DEFEATING INSERT IN AN FT-SWITCH

(75) Inventors: Kyly Belhumeur, Cochrane (CA); Keith Lessard, Cochrane (CA); Don Elliott, Cochrane (CA)

(73) Assignee: Hemicycle Controls Inc., Chambly (CA)

( * ) Notice: Subject to any disclaimer, the term of this patent is extended or adjusted under 35 U.S.C. 154(b) by 406 days.

(21) Appl. No.: 12/788,958

(22) Filed: May 27, 2010

(65) Prior Publication Data
US 2011/0291667 A1 Dec. 1, 2011

(51) Int. Cl.
*G01R 31/02* (2006.01)
(52) U.S. Cl. ............................ 324/424; 324/180; 200/15
(58) Field of Classification Search .................... 324/555
See application file for complete search history.

(56) References Cited

U.S. PATENT DOCUMENTS

| | | | | |
|---|---|---|---|---|
| 2,530,945 A | * | 11/1950 | Chapman et al. | 361/837 |
| 2,982,810 A | * | 5/1961 | Kleinschmidt et al. | 178/4 |
| 3,617,670 A | * | 11/1971 | Linderfelt | 200/533 |
| 4,149,053 A | * | 4/1979 | Long | 200/522 |
| D595,170 S | | 6/2009 | Masters et al. | |

FOREIGN PATENT DOCUMENTS
EP 0167771 B1 7/1988

OTHER PUBLICATIONS

Arndt, EP 0167771, EPO machine translation, p. 1-5.*
GE Consumer Industrial Multiln "FT Test Switch Product Description", 10 pages.
ABB Inc. "FT Flexitest Family Product Description" 6 pages, dated Nov. 2005.
ABB, Inc. "Flexitest Switch Type FT-1 Product Description—Descriptive Bulletin 41-077" 16 pages, Apr. 2002.

* cited by examiner

*Primary Examiner* — Thomas Valone
(74) *Attorney, Agent, or Firm* — Barley Snyder

(57) ABSTRACT

A modular test plug for voltage, current and saturation testing has a housing having a handle portion, a plurality of jaw connections for injecting upstream toward the equipment to be tested, a plurality of blade connections for injecting downstream toward a transformer, a first plurality of binding posts on a top of the housing connected to the jaw connections, and a second plurality of binding posts also on a top of the housing connected to the blade connections. Also provided is a short-defeating insert for defeating a shorting mechanism in an FT switch. This insert has a thin flat extension member extending from the body to prevent a bottom cam on a shorting blade from making contact with a shorting spring that would otherwise short the circuit when the switch handle is moved from the open position to the closed position.

1 Claim, 3 Drawing Sheets

SHORT-DEFEATING INSERT IN AN FT-SWITCH

FIELD OF THE INVENTION

The present invention relates generally to testing of power station instrumentation and protection devices and, more particularly, to FT test switches and their corresponding test plugs.

BACKGROUND

In electrical power systems, higher voltage and current levels (e.g. 600V to 745 kV, or higher, and currents greater than about 5 amps) cannot be physically measured directly by use of a voltage or current meter for safety and practical reasons. As a result, intermediate devices called instrument transformers are used to step the voltage and current down to safe and useable levels. These instrument transformers are subdivided into current transformers (CTs) and potential (voltage) transformers (PTs). The CTs and PTs produce signals proportional to the higher level values so that, by using simple multiplying factors, the actual higher level values can be calculated for uses such as metering and protection.

As is known in the art, so-called FT switches (such as those manufactured and sold by ABB and GE) are used in the industry for working with CT and PT circuits.

FT switches are typically mounted on the front of switchboard panels at a substation. The FT switch usually has a base and cover that may be made of moulded polycarbonate or other such polymer. Insulating barriers are moulded into the base to insulate the switch units (poles) from one another.

FT switches typically have anywhere from one to ten poles (i.e. switch units). Conventionally, each pole (switch unit) is identified with a letter or other such identifier. Two different types of poles exist: (i) potential poles and (ii) current poles.

Potential poles have a single, non-shorting knife blade. Current poles are usually designed as pairs of knife blades, a non-shorting knife blade ("metering pole") and a shorting knife blade ("shorting pole"). When the handle of the shorting blade is moved to the open position, the shorting blade disengages from the jaw. However, before the shorting blade disengages from the jaw, a bottom cam on the shorting blade makes contact with a shorting spring that shorts out the circuit.

Each pole (switch unit) of the FT switch typically includes its own finger-operated switch handle for independently operating each switch unit. Knife blade switches may also be ganged together (e.g. with a horizontal interlocking bar or other such mechanism) so that multiple poles can be opened or closed in unison.

A test plug is inserted into the FT switch once all of its poles are opened. These test plugs have anywhere from one to ten poles and allow injection "upwards" toward the jaw terminal of the switches, thereby permitting field personnel to inject towards meters and relays for testing purposes.

A separate source test plug isolates the external connections from the relay, meter or other equipment being tested. Such a test plug fits into the stationary contact jaws of an FT switch. The L-shaped test blade ensures accurate alignment between the test plug and the stationary contact jaws.

This separate source test plug connects the relay inputs and outputs to a set of binding posts on the top of the test plug and completely isolates the relay circuit from the external connections by means of an insulated barrier along the bottom of the plug. The external test circuits can then be connected to these binding posts, which are usually staggered for better accessibility. Before inserting the separate source test plug, all switch blades must be placed in the fully open position.

One enduring shortcoming of this prior-art technology is that the test plug only permits injection toward the jaw terminal of the switches, but not (in the opposite direction) toward the transformers.

In view of this shortcoming, an improvement on this prior-art test plug would thus be highly desirable.

SUMMARY

The present invention provides, in general, a novel modular test plug to be used with FT switches, a novel testing method and a novel insert for defeating the shorting mechanism on an FT switch. This novel test plug, method and insert thereby enable the testing of meters, relays, instrumentation and other substation equipment with a single "all-in-one" component.

In accordance with one main aspect of the present invention, a modular test plug for voltage, current and saturation testing of electrical equipment has a housing having a handle portion at a rear of the housing, a plurality of jaw connections extending from a front of the housing for injecting upstream toward the equipment to be tested, a plurality of blade connections also extending from the front of the housing for injecting downstream toward a transformer, a first plurality of binding posts on a top of the housing, the first plurality of binding posts being connected to the jaw connections, and a second plurality of binding posts also on a top of the housing, the second plurality of binding posts being connected to the blade connections.

In accordance with another main aspect of the present invention, a method for testing protective relays, meters and instruments using an FT switch entails providing a test plug having a plurality of jaw connections and a plurality of blade connections, injecting downstream toward a transformer using the plurality of blade connections, and measuring one or both of current and voltage using one or more of a first plurality of binding posts that are electrically connected to the blade connections and to the transformer.

In accordance with yet another main aspect of the present invention, a short-defeating insert for defeating a shorting mechanism in an FT switch, the insert including a body made of an electrically insulating material, a plurality of compartments arranged in a line, each compartment being adapted to accommodate displacement of a switch handle from a closed position to an open position, and a thin flat extension member extending from the body to prevent a bottom cam on a shorting blade from making contact with a shorting spring that would otherwise short the circuit when the switch handle is moved from the open position to the closed position.

BRIEF DESCRIPTION OF THE DRAWINGS

Further features and advantages of the present technology will become apparent from the following detailed description, taken in combination with the appended drawings, in which.

It will be noted that throughout the appended drawings, like features are identified by like reference numerals.

DETAILED DESCRIPTION

Figure 4:
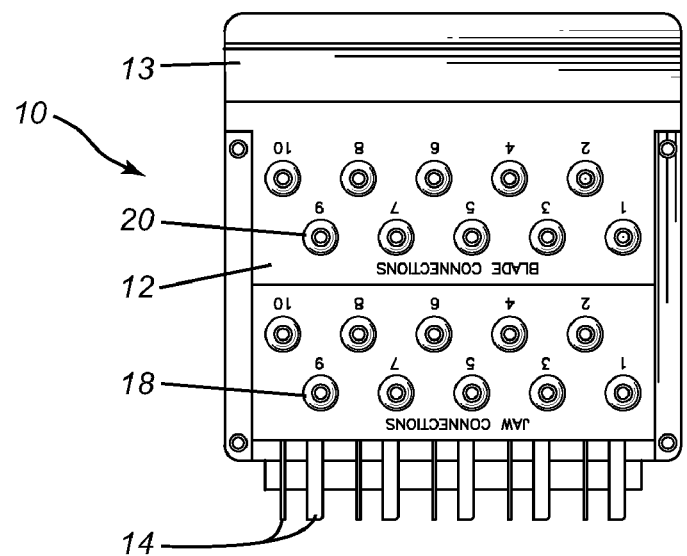
FIG. 4 is a top view of the modular test plug of FIG. 1.
Figure 1:
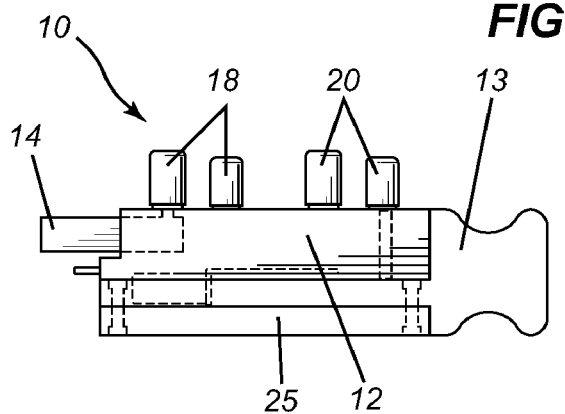
FIG. 1 is a side view of a modular test plug for testing voltage, current and saturation on an FT switch in accordance with an embodiment of the present invention.
Figure 2:
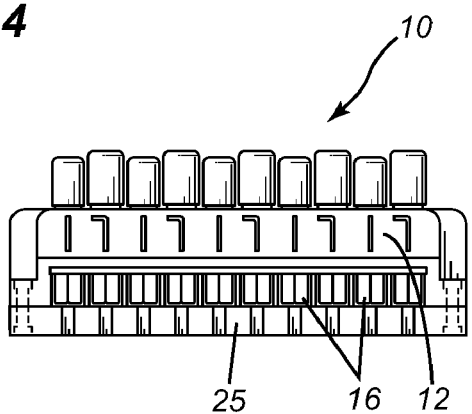
FIG. 2 is a front view of the modular test plug of FIG. 1.
Figure 3:
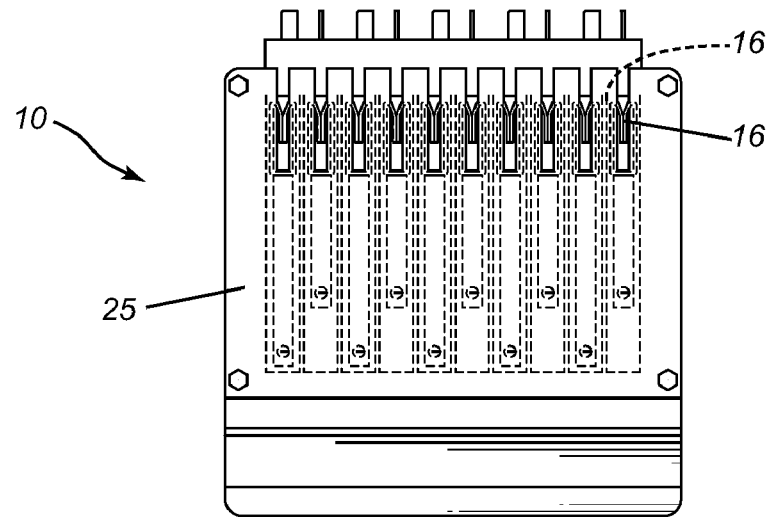
FIG. 3 is a bottom view of the modular test plug of FIG. 1.

In general, the present invention is directed to a novel test plug which is generally designated by reference numeral 10 in the appended figures.

As depicted in FIGS. 1-4, the test plug 10 in accordance with an embodiment of the present invention includes a body or housing 12 (with a protective cover 25) and a handle 13 at a rear of the housing. The test plug 10 has a plurality of jaw connections 14 for injecting upstream toward the equipment to be tested. The test plug also includes a plurality of blade connections 16 for injecting downstream toward a transformer. A first plurality of binding posts 18 on a top of the test plug are electrically connected to the jaw connections. A second plurality of binding posts 20 on a top of the test plug are electrically connected to the blade connections.

In the specific embodiment depicted in FIGS. 1-4, the test plug 10 has ten jaw connections and ten blade connections. Ten binding posts are electrically connected to the ten respective jaw connections. Another ten binding posts are electrically connected to the ten respective blade connections. There are thus twenty binding posts in total in this particular embodiment of the present invention.

As will be appreciated, the number, shape and configuration of jaw connections may be varied to operate with different types of switches. Likewise, the number, shape and configuration of blade connections may be varied to operate with different types of switches. Where the number of blade and/or jaw connections is varied, the number of binding posts would be varied so that there is a one-to-one correlation between connections and binding posts.

As is known in the art, a binding post is a connector that terminates (attaches to) a single wire or test lead. A binding post contains a central threaded metal rod and a cap that screws down on that rod. The cap is commonly insulated with plastic and color-coded. It should be appreciated that other connectors may be substituted in lieu of the binding posts.

The "all-in-one" design of this novel test plug enables injection upward ("upstream") towards the jaw terminal (jaw connections) of the switches. This allows field personnel to inject toward meters and relays for testing purposes. Due to the novel design of this test plug, it is also possible to use the same test plug to inject downwards ("downstream") toward the current transformers and/or potential transformers.

Particularly, it would be used in this way for conducting so-called "saturation tests" on current transformers.

Figure 5:
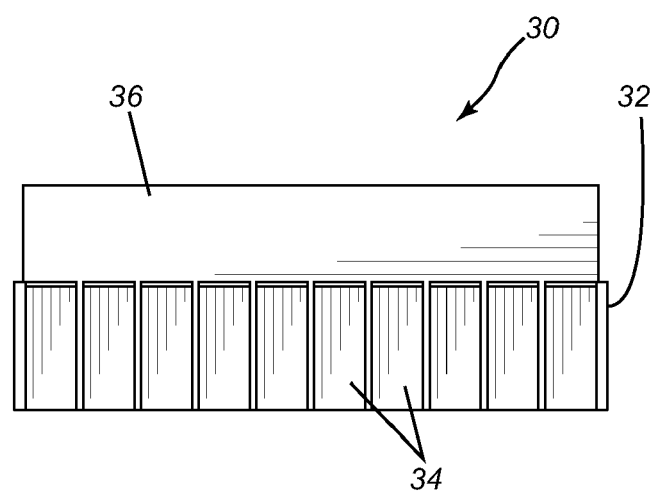
FIG. 5 is a top view of a short-defeating insert in accordance with another aspect of the present invention.
Figure 6:
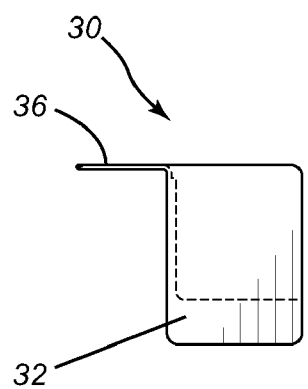
FIG. 6 is side view of the insert of FIG. 5.
Figure 7:
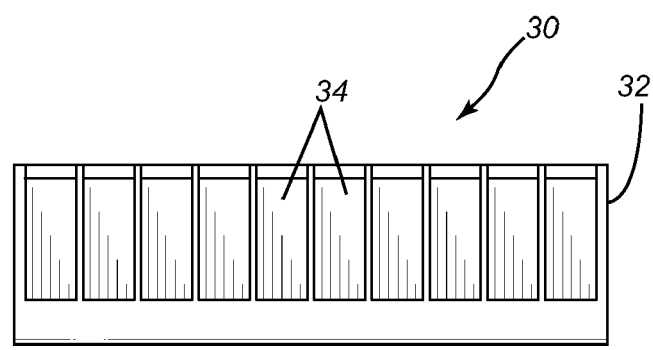
FIG. 7 is a back view of the insert of FIG. 5.

As shown in FIGS. 5-7, a short-defeating insert 30 has a body 32 made of an electrically insulating material, a plurality of compartments or slots 34 arranged in a line. Each compartment or slot 34 is adapted (dimensioned) to accommodate displacement of a switch handle 52 (shown in FIG. 9) from a closed position to an open position. A thin flat extension member 36 extends from the body to prevent a bottom cam on a shorting blade from making contact with a shorting spring that would otherwise short the circuit when the switch handle is moved from the open position to the closed position.

Figure 8:
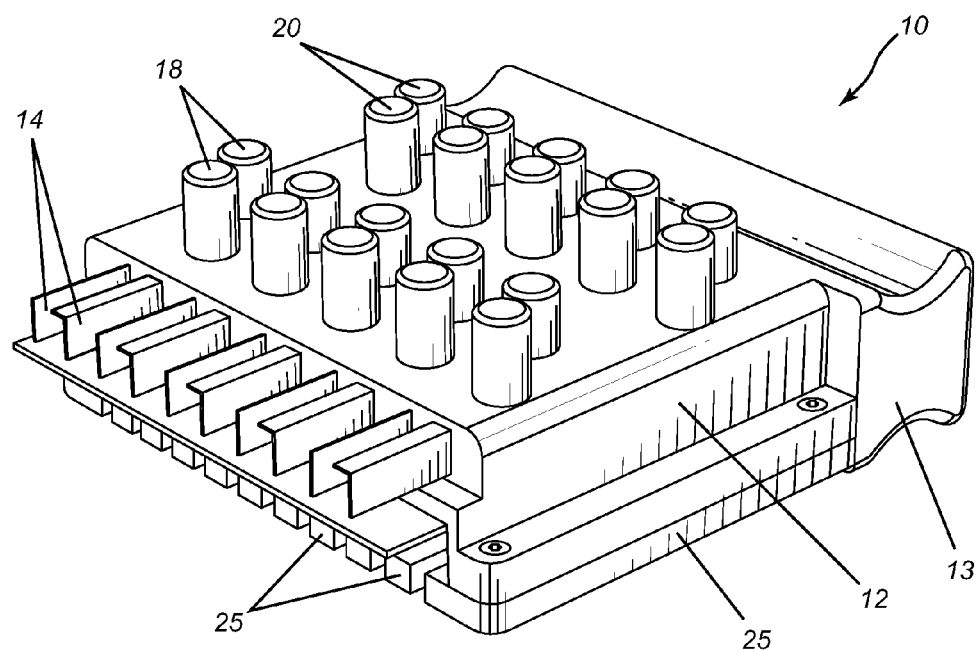
FIG. 8 is an isometric view of the test plug.

FIG. 8 is an isometric view of the test plug 10. The test plug of FIG. 8 has a protective cover for covering the jaw connections.

Figure 9:
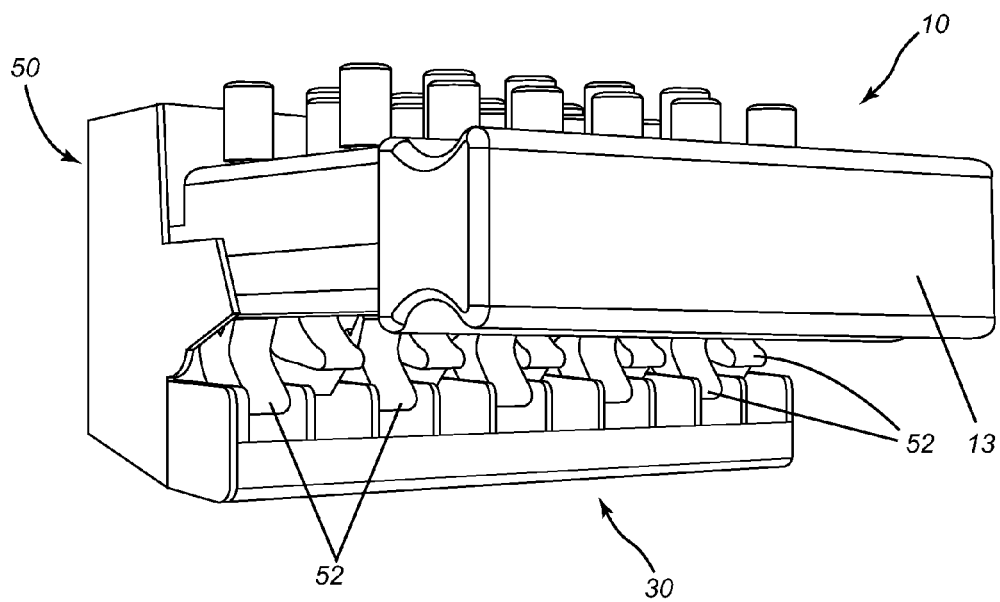
FIG. 9 is an isometric view of the test plug and short-defeating insert inserted into an FT switch.

FIG. 9 is an isometric view of the test plug 10 and short-defeating insert 30 inserted into an FT switch 50. In operation, the test plug 10 can be used in concert with an FT switch 50 to conduct testing of meters, relays, instrumentation or other substation equipment. This testing can be performed by providing the test plug 10 with the plurality of jaw connections and with the plurality of blade connections (for bidirectional injection), by injecting downstream toward a transformer using the plurality of blade connections, and by measuring one or both of current and voltage using one or more of a first plurality of binding posts that are electrically connected to the blade connections and to the transformer. As noted above, so-called saturation tests can thus be performed using this test plug. The insert of FIG. 5-7 is inserted into the FT switch before it is opened to defeat the FT shorting mechanism. Conventionally, technicians or field personnel use tie-wraps or similar objects to defeat the FT shorting mechanisms. The insert provides a more effective and safer means to open-circuit a de-energized ("dead") current transformer.

The embodiments of the invention described above are intended to be exemplary only. As will be appreciated by those of ordinary skill in the art, to whom this specification is addressed, many obvious variations, modifications, and refinements can be made to the embodiments presented herein without departing from the spirit and scope of the invention. The scope of the exclusive right sought by the applicant is therefore intended to be limited solely by the appended claims.

The invention claimed is:

1. A short-defeating insert for defeating a shorting mechanism in an FT switch, the insert comprising:
 a body made of an electrically insulating material;
 a plurality of compartments arranged in a line, each compartment being adapted to accommodate displacement of a switch handle from a closed position to an open position; and
 a thin flat extension member extending from the body to prevent a bottom cam on a shorting blade from making contact with a shorting spring that would otherwise short the circuit when the switch handle is moved from the open position to the closed position.

\* \* \* \* \*